US012584982B2

(12) United States Patent　　(10) Patent No.:　US 12,584,982 B2

Wiesinger et al.　　(45) Date of Patent:　Mar. 24, 2026

(54) SYSTEM AND METHOD FOR MAGNETIC RESONANCE IMAGING WITH VARIABLE ECHO TIME

(71) Applicant: GE Precision Healthcare LLC, Waukesha, WI (US)

(72) Inventors: Florian Wiesinger, Freising (DE); Michael Carl, Escondido, CA (US)

(73) Assignee: GE Precision Healthcare LLC, Waukesha, WI (US)

( * ) Notice: Subject to any disclaimer, the term of this patent is extended or adjusted under 35 U.S.C. 154(b) by 176 days.

(21) Appl. No.: 18/240,502

(22) Filed: Aug. 31, 2023

(65) Prior Publication Data

US 2025/0076434 A1　　Mar. 6, 2025

(51) Int. Cl.
　G01V 3/00　　(2006.01)
　G01R 33/48　　(2006.01)
　G01R 33/50　　(2006.01)
(52) U.S. Cl.
　CPC ..... G01R 33/4828 (2013.01); G01R 33/4818 (2013.01); G01R 33/50 (2013.01)
(58) Field of Classification Search
　CPC .............. G01R 33/5608; G01R 33/385; G01R 33/4824; G01R 33/4828; G01R 33/50; G01R 33/561; A61B 5/4312; A61B 5/004
　USPC ....................................................... 324/309
　See application file for complete search history.

(56) References Cited

U.S. PATENT DOCUMENTS

| 9,594,139 B2 | 3/2017 | Wiesinger | |
| 10,969,451 B1 | 4/2021 | Wiesinger | |
| 11,275,142 B1 * | 3/2022 | Wiesinger | G01R 33/5608 |
| 2019/0219653 A1 * | 7/2019 | Shiodera | G01R 33/54 |

FOREIGN PATENT DOCUMENTS

| CN | 108697369 A | * | 10/2018 | ........... G01R 33/443 |
| CN | 107997763 B | * | 1/2021 | ............. A61B 5/055 |
| EP | 3480615 A1 | * | 5/2019 | ............. A61B 5/055 |
| JP | 6467344 B2 | * | 2/2019 | ........... G01R 33/385 |
| KR | 101951000 B1 | * | 2/2019 | ............. A61B 5/055 |

OTHER PUBLICATIONS

Brodsky et al., "Generalized k-space decomposition with chemical shift correction for non-cartesian water-fat imaging." Magnetic Resonance in Medicine: an Official Journal of the International Society for Magnetic Resonance in Medicine 59.5 (2008): 1151-1164, 14 pages.

(Continued)

*Primary Examiner* — Walter L Lindsay, Jr.
*Assistant Examiner* — Frederick Wenderoth

(57)　　　　　　ABSTRACT

A method for imaging a subject using an MRI system includes determining a plurality of echo times and then acquiring a plurality of variable echo time signals corresponding to the plurality of echo times at a plurality of k-space locations. In the method, a water k-space data signal and a fat k-space data signal is generated for each of the plurality of k-space locations based on the plurality of variable echo time signals corresponding to that k-space location. Finally, the method includes generating a medical image of the subject based on water k-space data signals and fat k-space data signals at the plurality of k-space locations respectively.

20 Claims, 7 Drawing Sheets

(56) References Cited

OTHER PUBLICATIONS

Eggers et al., "Dual-Repetition Gradient-Echo Dixon Imaging with High Signal-to-Noise Ratio Efficiency." ISMRM 2020, p. 3726, 3 pages.

Engström et al., "In-phase zero TE musculoskeletal imaging." Magnetic resonance in medicine 83.1 (2020): 195-202, 8 pages.

Wiesinger et al., "IDEAL spiral CSI for dynamic metabolic MR imaging of hyperpolarized [1-13C] pyruvate." Magnetic resonance in medicine 68.1 (2012): 8-16, 9 pages.

Wiesinger et al., "Zero TE bone imaging." ISMRM 2014, p. 4261, 1 page.

Wiesinger et al., "Zero TE MR bone imaging in the head." Magnetic resonance in medicine 75.1 (2016): 107-114, 8 pages.

Wiesinger et al., "Zero TE-based pseudo-CT image conversion in the head and its application in PET/MR attenuation correction and MR-guided radiation therapy planning." Magnetic resonance in medicine 80.4 (2018): 1440-1451, 12 pages.

* cited by examiner

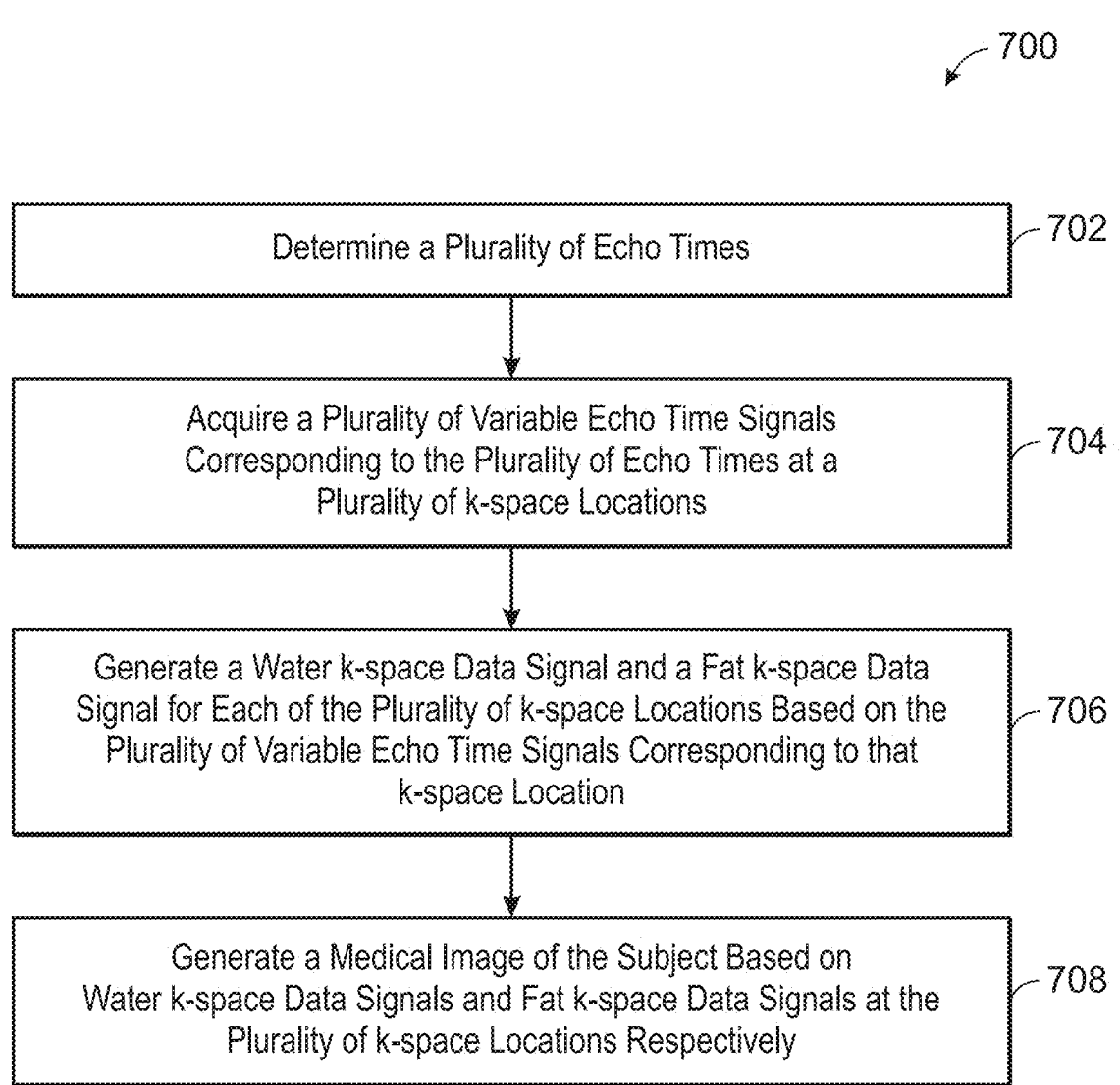

700

Determine a Plurality of Echo Times ⌐702

Acquire a Plurality of Variable Echo Time Signals
Corresponding to the Plurality of Echo Times at a
Plurality of k-space Locations ⌐704

Generate a Water k-space Data Signal and a Fat k-space Data
Signal for Each of the Plurality of k-space Locations Based on the
Plurality of Variable Echo Time Signals Corresponding to that
k-space Location ⌐706

Generate a Medical Image of the Subject Based on
Water k-space Data Signals and Fat k-space Data Signals at the
Plurality of k-space Locations Respectively ⌐708

FIG. 7

SYSTEM AND METHOD FOR MAGNETIC RESONANCE IMAGING WITH VARIABLE ECHO TIME

BACKGROUND

Embodiments disclosed in the present invention relate to magnetic resonance imaging (MRI) systems and methods, and more particularly, to techniques for enhancing the quality and accuracy of MRI imaging.

As a medical imaging modality, Magnetic resonance imaging (MRI), can obtain images of the human body without using X-rays or other ionizing radiation. MRI uses a magnet having a strong magnetic field to generate a static magnetic field B0. When a part of the human body to be imaged is positioned in the static magnetic field B0, nuclear spin associated with hydrogen nuclei in human tissue is polarized, so that the tissue of the to-be-imaged part generates a longitudinal magnetization vector at a macroscopic level. After a radio-frequency field B1 intersecting the direction of the static magnetic field B0 is applied, the direction of rotation of protons changes so that the tissue of the to-be-imaged part generates a transverse magnetization vector at a macroscopic level. After the radio-frequency field B1 is removed, the transverse magnetization vector decays in a spiral manner until it is restored to zero. A free induction decay signal is generated during decay. The free induction decay signal can be acquired as a magnetic resonance signal, and a tissue image of the to-be-imaged part can be reconstructed based on the acquired signal.

Generally, MRI provides detailed anatomical and functional information about various tissues within the human body. However, traditional MRI techniques have often faced challenges when imaging bone structures due to the low signal intensity and short T2 relaxation times associated with bone tissue. As a result, bone imaging has historically been limited in its resolution and contrast, hampering its clinical utility for accurate diagnosis and assessment of bone-related pathologies.

Efforts have been made to improve bone MRI imaging by employing specialized pulse sequences, contrast agents, and hardware modifications. Some techniques have focused on optimizing pulse sequences to enhance bone signal while suppressing unwanted signals from surrounding tissues.

Therefore, there is a need for an improved approach that overcomes the limitations of existing bone MRI imaging techniques.

BRIEF DESCRIPTION

In accordance with an embodiment of the present technique, a method for imaging a subject using an magnetic resonance imaging (MRI) system is provided. The method includes determining a plurality of echo times and acquiring a plurality of variable echo time signals corresponding to the plurality of echo times at a plurality of k-space locations. The method also includes generating a water k-space data signal and a fat k-space data signal for each of the plurality of k-space locations based on the plurality of variable echo time signals corresponding to that k-space location. Finally, the method includes generating a medical image of the subject based on water k-space data signals and fat k-space data signals.

In accordance with another embodiment of the present technique, a magnetic resonance imaging (MRI) system including a magnet configured to generate a polarizing magnetic field about at least a portion of a subject arranged in the MRI system is provided. The MRI system further includes a gradient coil assembly including a readout gradient coil, a phase gradient coil, a slice selection gradient coil configured to apply at least one gradient field to the polarizing magnetic field. The MRI system also includes a radio frequency (RF) system configured to apply an RF field to the subject and to receive magnetic resonance signals from the subject and a processing system. The processing system is programmed to determine a plurality of echo times and acquire a plurality of variable echo time signals corresponding to the plurality of echo times at a plurality of k-space locations. The processing system is further programmed to generate a water k-space data signal and a fat k-space data signal for each of the plurality of k-space locations based on the plurality of variable echo time signals corresponding to that k-space location. The processing system is also programmed to generate a medical image of the subject based on water k-space data signals and fat k-space data signals at the plurality of k-space locations respectively.

DRAWINGS

These and other features, aspects, and advantages of the present invention will become better understood when the following detailed description is read with reference to the accompanying drawings in which like characters represent like parts throughout the drawings, wherein:

FIG. 7 is a flow chart representing a method for generating the MR image of a subject in accordance with an embodiment of the present technique.

DETAILED DESCRIPTION

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decisions may be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present embodiments, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments. Furthermore, the terms "circuit" and "circuitry" and "controller" may include either a single component or a plurality of components, which are either active and/or passive and are connected or otherwise coupled together to provide the described function.

In magnetic resonance imaging (MRI), an object or a subject is placed in a magnet. When the object is in the magnetic field generated by the magnet, magnetic moments of nuclei, such as protons, attempt to align with the magnetic field but process about the magnetic field in a random order at the nuclei's Larmor frequency. The magnetic field of the magnet is referred to as B0 and extends in the longitudinal or z direction. In acquiring a MR image, a magnetic field (referred to as an excitation field B1), which is in the x-y plane and near the Larmor frequency, is generated by a radio-frequency (RF) coil and may be used to rotate, or "tip," the net magnetic moment M2 of the nuclei from the z direction to the transverse or x-y plane. A signal, which is referred to as a MR signal, is emitted by the nuclei, after the excitation signal B1 is terminated. To use the MR signals to generate an image of an object, magnetic field gradient pulses (Gx, Gy, and Gz) are used. The gradient pulses are used to scan through the k space, the space of spatial frequencies or inverse of distances. A Fourier relationship exists between the acquired MR signals and an image of the object, and therefore the image of the object can be derived by reconstructing the MR signals. The images of the object may include two dimensional (2D) or three-dimensional (3D) images.

Figure 1:
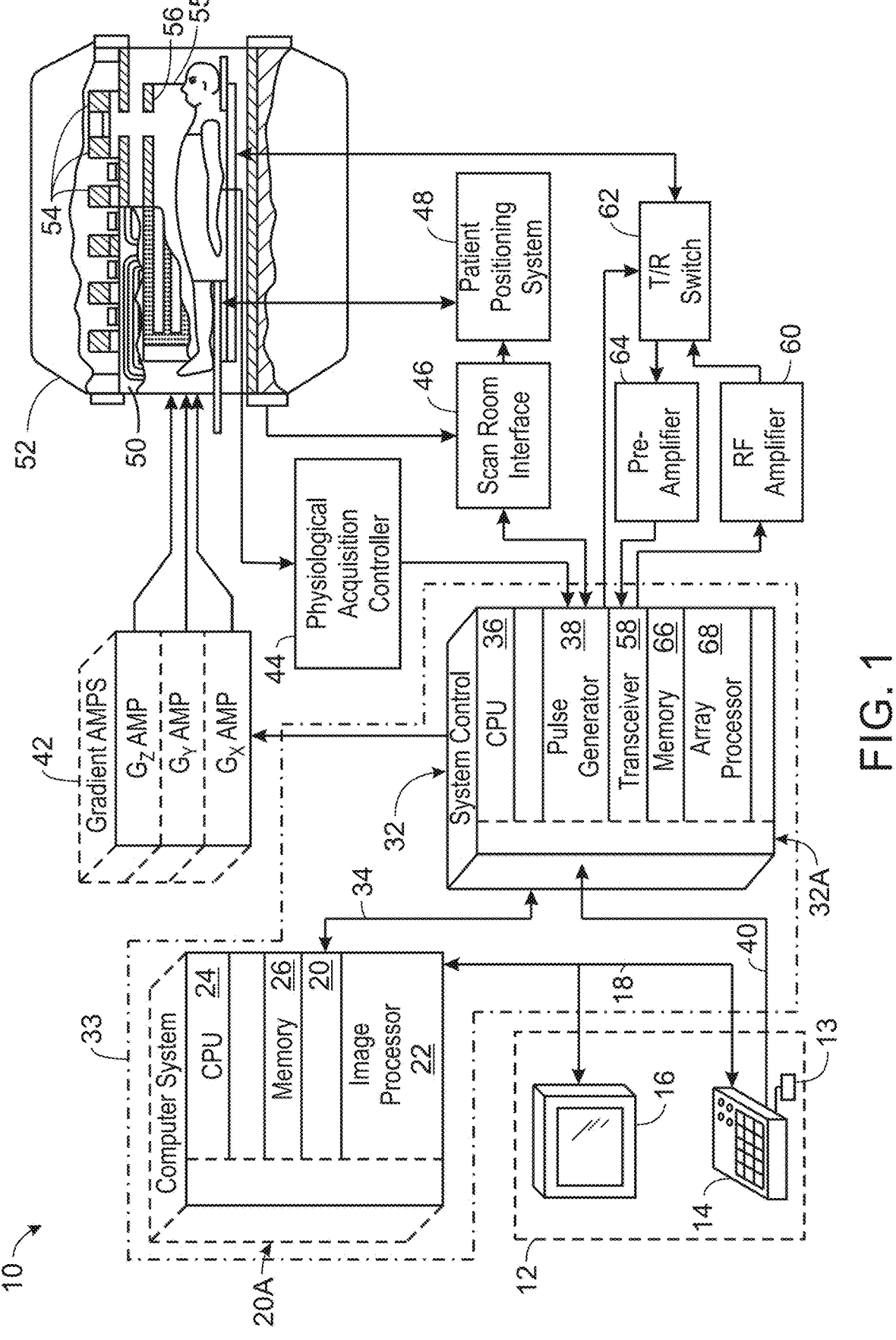
FIG. 1 is a schematic diagram of an exemplary magnetic resonance imaging (MRI) system, in accordance with an embodiment of the present technique.

Embodiments of the present disclosure will now be described, by way of an example, with reference to the figures, in which FIG. 1 is a schematic diagram of a magnetic resonance imaging (MRI) system 10. Operation of the system 10 may be controlled from an operator console 12, which includes an input device 13, a control panel 14, and a display screen 16. The input device 13 may be a mouse, joystick, keyboard, track ball, touch activated screen, light wand, voice control, and/or other input device. The input device 13 may be used for interactive geometry prescription. The console 12 communicates through a link 18 with a computer system 20 that enables an operator to control the production and display of images on the display screen 16. The link 18 may be a wireless or wired connection. The computer system 20 may include modules that communicate with each other through a backplane 20A. The modules of the computer system 20 may include an image processor module 22, a central processing unit (CPU) module 24, and a memory module 26 that may include a frame buffer for storing image data arrays, for example. The computer system 20 may be linked to archival media devices, permanent or back-up memory storage or a network for storage of image data and programs and communicates with MRI system control 32 through a high-speed signal link 34. The MRI system control 32 may be separate from or integral with the computer system 20. The computer system 20 and the MRI system control 32 collectively form an "MRI controller" 33 or "controller".

In the exemplary embodiment, the MRI system control 32 includes modules connected by a backplane 32a. These modules include a CPU module 36 as well as a pulse generator module 38. The CPU module 36 connects to the operator console 12 through a data link 40. The MRI system control 32 receives commands from the operator through the data link 40 to indicate the scan sequence that is to be performed. The CPU module 36 operates the system components to carry out the desired scan sequence and produces data which indicates the timing, strength and shape of the RF pulses produced, and the timing and length of the data acquisition window. The CPU module 36 connects to components that are operated by the MRI controller 32, including the pulse generator module 38 which controls a gradient amplifier 42, a physiological acquisition controller (PAC) 44, and a scan room interface circuit 46.

In one example, the CPU module 36 receives patient data from the physiological acquisition controller 44, which receives signals from sensors connected to the object, such as ECG signals received from electrodes attached to the patient. As used herein, an object or a subject is a human (or patient), an animal, or a phantom. The CPU module 36 receives, via the scan room interface circuit 46, signals from the sensors associated with the condition of the patient and the magnet system. The scan room interface circuit 46 also enables the MRI controller 33 to command a patient positioning system 48 to move the patient to a desired position for scanning.

A whole-body RF coil 56 is used for transmitting the waveform towards subject anatomy. The whole body-RF coil 56 may be a body coil. An RF coil may also be a local coil that may be placed in more proximity to the subject anatomy than a body coil. The RF coil 56 may also be a surface coil. RF coils containing RF receiver channels may be used for receiving the signals from the subject anatomy. Typical surface coil would have eight receiving channels; however, different number of channels are possible. Using the combination of both a body coil 56 and a surface coil is known to provide better image quality.

The pulse generator module 38 may operate the gradient amplifiers 42 to achieve desired timing and shape of the gradient pulses that are produced during the scan. The gradient waveforms produced by the pulse generator module 38 may be applied to the gradient amplifier system 42 having Gx, Gy, and Gz amplifiers. Each gradient amplifier excites a corresponding physical gradient coil in a gradient coil assembly 50, to produce the magnetic field gradients used for spatially encoding acquired signals. Specifically, Gx corresponds to a flow/frequency encoding gradient, Gy corresponds to a phase encoding gradient and Gz corresponds to a slice select gradient. The gradient coil assembly 50 may form part of a magnet assembly 52, which also includes a polarizing magnet 54 (which, in operation, provides a longitudinal magnetic field $B_0$ throughout a target volume 55 that is enclosed by the magnet assembly 52 and a whole-body RF coil 56 (which, in operation, provides a transverse magnetic field B1 that is generally perpendicular to B0 throughout the target volume 55. A transceiver module 58 in the MRI system control 32 produces pulses that may be amplified by an RF amplifier 60 and coupled to the RF coil 56 by a transmit/receive switch 62. The resulting signals emitted by the excited nuclei in the subject anatomy may be sensed by receiving coils (not shown) and provided to a preamplifier 64 through the transmit/receive switch 62. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the receiving coil during the receive mode.

The MR signals produced from excitation of the target are digitized by the transceiver module 58. The MRI system control 32 then processes the digitized signals by Fourier transform to produce k-space data, which is transferred to a memory module 66, or other computer readable media, via the MRI system control 32. "Computer readable media" may include, for example, structures configured so that electrical, optical, or magnetic states may be fixed in a manner perceptible and reproducible by a conventional computer (e.g., text or images printed to paper or displayed on a screen, optical discs, or other optical storage media, "flash" memory, EEPROM, SDRAM, or other electrical storage media; floppy or other magnetic discs, magnetic tape, or other magnetic storage media).

A scan is complete when an array of raw k-space data has been acquired in the computer readable media 66. This raw k-space data is rearranged into separate k-space data arrays for each image to be reconstructed, and each of these k-space data arrays is input to an array processor 68, which operates to reconstruct the data into an array of image data, using a reconstruction algorithm such as a Fourier transform. When the full k-space data is obtained, it represents entire volume of the subject body and the k-space so obtained may be referred as the reference k-space. Similarly, when only the partial k-space data is obtained, the image may be referred as the partial k-space. This image data is conveyed through the data link 34 to the computer system 20 and stored in memory. In response to the commands received from the operator console 12, this image data may be archived in a long-term storage or may be further processed by the image processor 22 and conveyed to the operator console 12 and presented on the display 16.

MR signals are represented by complex numbers, where each location at the k-space is represented by a complex number, with I and Q quadrature MR signals being the real and imaginary components. Complex MR images may be reconstructed based on I and Q quadrature MR signals, using processes such as Fourier transform of the k-space MR data. Complex MR images are MR images with each pixel represented by a complex number, which also has a real component and an imaginary component. The magnitude M of the received MR signal may be determined as the square root of the sum of the squares of the/and Q quadrature components of the received MR signal as in Eq. (3) below:

$$M = \sqrt{I^2 + Q^2} \tag{1}$$

and the phase $\phi$ of the received MR signal may also be determined as in eq. (2) below:

$$\phi = \tan^{-1}\left(\frac{Q}{I}\right) \tag{2}$$

In general, MRI is capable of generating images with various contrasts, which highlight different tissue properties and characteristics. These contrasts provide valuable information about tissue composition, relaxation times, and other physiological parameters. By acquiring multiple contrasts, clinicians and researchers can gain a more comprehensive understanding of the tissues being imaged, aiding in diagnosis, characterization, and treatment planning. Some techniques for such multiple contrast images include T1-weighted imaging technique, T2-weighted imaging technique, Gradient Echo imaging technique and free-induction-decay (FID) zero echo time (ZTE) imaging technique. Each of these images have different applications.

For bone imaging application, many clinicians use ZTE imaging technique. ZTE imaging technique generates magnitude and phase images of the patient. In ZTE imaging, image encoding starts immediately at the time of RF excitation, effectively resulting in a nominal zero echo time (TE). This unique characteristic enables ZTE to capture signals from tissues with very short T2* relaxation times, such as bone and tendons, which would otherwise be challenging to visualize using conventional imaging methods.

Liver Acceleration Volume Acquisition (LAVA) Flexible (Flex) imaging technique is another technique that clinicians use for bone imaging and specifically for sacroiliac joint imaging. LAVA Flex is a three dimensional (3D), fast spoiled gradient echo (FSPGR) imaging technique that generates water only, fat only, in phase and out of phase echoes in one single acquisition. The echo time (TE) in LAVA Flex technique is generally longer than the ZTE technique because of the additional gradient refocusing.

Figure 2:
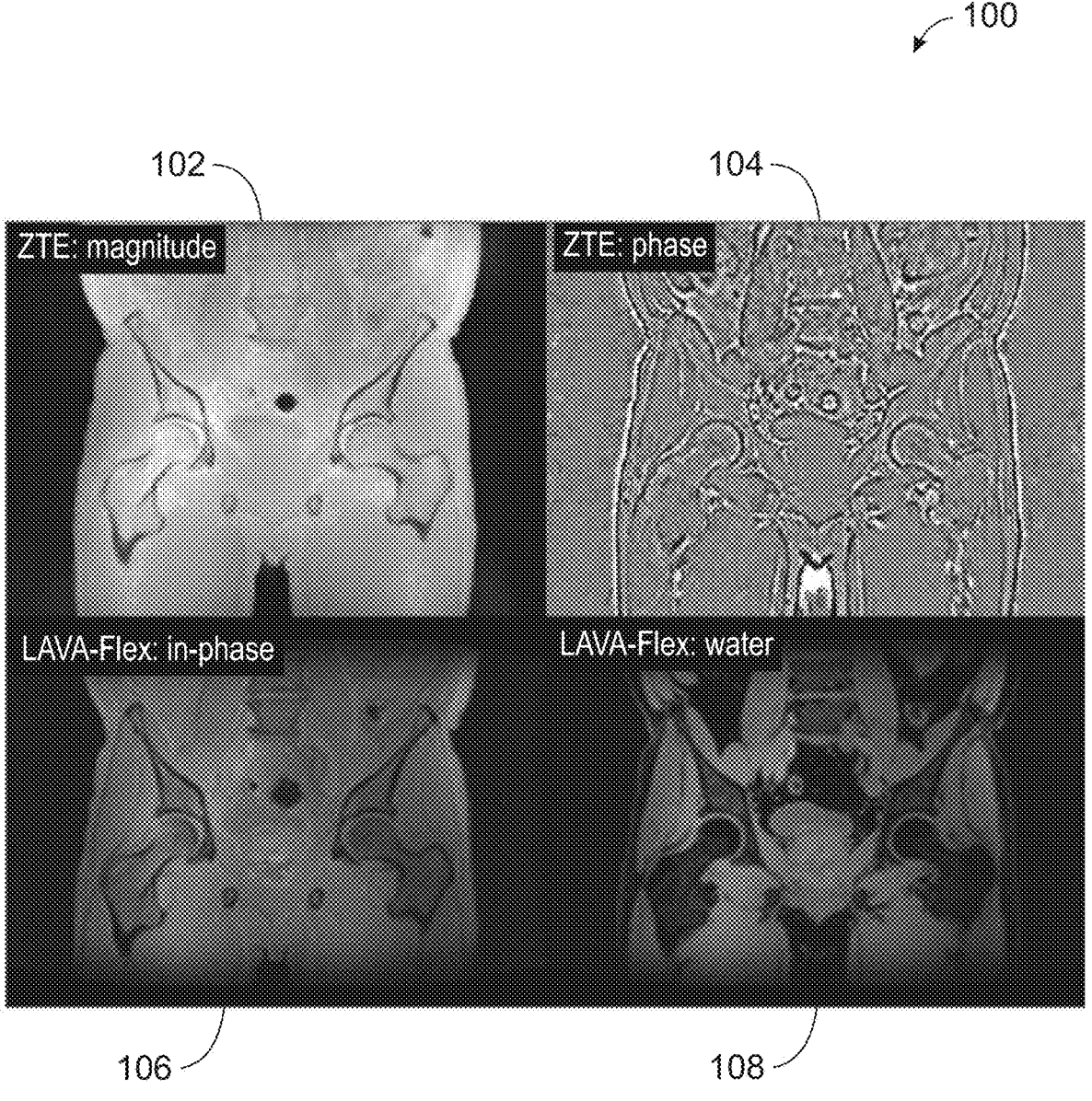
FIG. 2 is a schematic diagram depicting images acquired with zero echo time (ZTE) and Liver Acceleration Volume Acquisition Flexible (LAVA Flex) imaging techniques.

FIG. 2 is a schematic illustration 100 depicting images acquired with ZTE and LAVA Flex imaging techniques. Specifically, images 102 and 104 are acquired with ZTE technique and images 106 and 108 are acquired with LAVA Flex imaging technique. Image 102 is a ZTE magnitude image and image 104 is a ZTE phase image. Further image 106 is a LAVA Flex in-phase image and image 108 is a LAVA Flex water image.

As can be seen from images 102, 104, the bone structure appears with low signal intensity or appear dark, and the soft tissue structures appear bright with high signal intensity. It should be noted that occasionally for ZTE bone imaging an inverted gray scale colormap is used to highlight cortical bone structures. In general, the echo time has impact on the signal intensity detected from bone and tissue. Soft tissues, including muscles and organs, have longer T2* relaxation times compared to bone and tendons. As will be appreciated by those skilled in the art, T2* relaxation time is a parameter in MRI that describes the rate at which the MRI signal decays or loses coherence due to various factors, including local magnetic field inhomogeneities and interactions between neighboring nuclei (such as protons) within a tissue. The signal intensity(S) as a function of the echo time (TE) and T2* scales according to the following equation:

$$S = Mt_{ss} * e^{\left(\frac{-TE}{T2^*}\right)}$$

where $Mt_{ss}$ is the steady-state transverse magnetization. As can be seen from the above equation, long T2* signal components will decay slowly while short T2* signal components will decay very fast. Soft-tissue has long T2* hence it appears bright in the images 102, 104. Conversely, the bone has very short T2* (and also low proton density PD) and hence appears dark in images 102, 104.

Further, as can be seen from images 106, 108, in LAVA Flex imaging, the bone structures appear even darker and more pronounced surrounded by bright uniformly appearing soft tissue. It should be noted that the LAVA Flex imaging method is not possible with zero echo time, rather the method typically acquires in-phase and out-phase gradient echo (GRE) images which are then further resolved into fat and water components. In one embodiment, the LAVA Flex method may use the fat-water in-phase TE image (i.e., 4.6 ms at 1.5 T and 2.3 ms at 3 T). Further, in this method, a proton density (PD) weighting may be used to minimize soft-tissue T1 contrast which otherwise might disturb bone appearance.

As can be seen from FIG. 2, in ZTE imaging i.e., images 102 and 104 acquired with TE=0, the bone appears sharp but in certain locations slightly too bright (due to minimal T2* signal decay), resulting in areas of relatively weaker bone contrast. On the other hand, in the LAVA Flex in-phase image i.e., images 106 acquired at the fat-water in-phase echo time (i.e., TE=2.3 ms at 3 T, and TE=4.6 ms at 1.5 T), the bones appear sharp as well but in certain locations too dark (due to enhanced T2* signal decay), additionally also the soft-tissue appears less uniform because of pronounced fat-water chemical shift interferences especially around fat-water tissue interfaces. Therefore, in accordance with an embodiment of the present technique, the echo time is used as a flexible parameter to tune and to adjust for optimal bone appearance. In one embodiment, the echo time is a flexible parameter dependent on subject anatomy or user preference for bone depiction. Acquiring multiple TE enables in-phase reconstruction (clean of fat-water chemical shift effects) as well as fat-water separation.

One more issue that occurs in ZTE and LAVA Flex imaging methods explained above is that of chemical shift. Chemical shift is a phenomenon in MRI caused by slight differences in resonant frequencies of atomic nuclei, particularly in water and fat molecules. It affects the phase of MR signals, leading to image artifacts but also providing an opportunity for discriminating soft-tissue into fat and water constituents.

Figure 3:
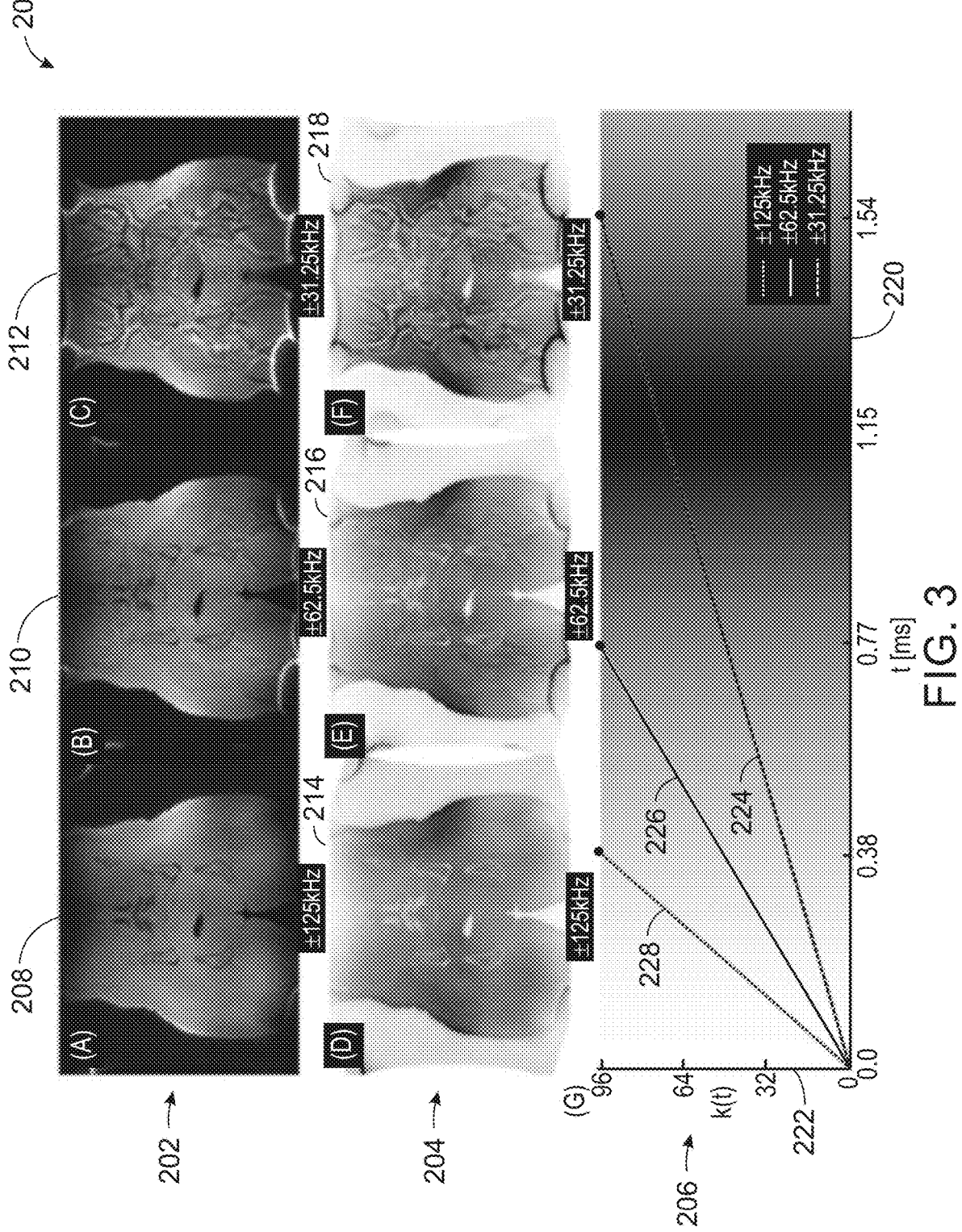
FIG. 3 is a schematic diagram illustrating the effect of fat-water chemical shift effects in the pelvis in the ZTE imaging method.

FIG. 3 shows a schematic diagram 200 illustrating the effect of fat-water chemical shift effects in the pelvis in the ZTE imaging method. The bottom row 206 in FIG. 3 shows a sampling time plot. Specifically, a horizontal axis 220 refers to time in milliseconds whereas a vertical axis 222 refers to the k-space sampling positions. As will be appreciated by those skilled in the art, the sampling time refers to the time duration between RF excitation and data acquisition. Further, the top row 202 shows pelvis images in linear gray scale whereas the middle row 204 shows the same pelvis images in inverter gray scale. Specifically, row 202 shows three images 208, 210 and 212 corresponding to imaging bandwidth of +125 kHz (plot 228), +62.5 kHz (plot 226) and +31.25 kHz (plot 224) respectively. Images 214, 216 and 218 in middle row 204 also correspond to bandwidth of +125 kHz, +62.5 kHz and +31.25 kHz respectively but with inverted gray scale.

The bottom row 206 also illustrates the effective sampling time (i.e., tn=n*Δt) dependent on the 3D center out radial sampling position and the imaging bandwidth (Δt=1/BW). For the highest imaging bandwidth (i.e., BW=+125 kHz, plot 228) with the shortest readout duration of only 0.38 ms, out-of-phase effects are minimal (i.e., fat and water are largely in-phase) and soft-tissue uniformity appears excellent. In comparison, for the lowest imaging bandwidth (i.e., BW=+31.25 kHz, plot 224) the readout duration is 1.54 ms and hence longer than the out-of-phase TE (i.e., 1.15 ms at 3 T) resulting in severe out-of-phase disturbances (i.e., fat and water are out of phase), primarily affecting tissue boundaries.

In one embodiment of the present technique, to correct the chemical shift artifacts, each radial k-space spoke is acquired multiple times at a plurality of echo times i.e., variable echo times. For example, each of the k-space lines of a radial k-space acquisition is acquired a plurality of times at a plurality of echo times. This process is referred to herein as a variable echo time acquisition. The plurality of echo time durations may be 2, 3, or more different echo times so the k-space line may be acquired 2, 3, or more often accordingly. In one embodiment, the number of the plurality of echo time durations and the time of these plurality of echo time durations are selected depend on desired image contrast and tissue properties. Moreover, the k-space data acquisition can be sequential or interleaved. When sequential, all data for one echo time (e.g., TE1) can be acquired first followed by all data for another echo time (e.g., TE2) and so on if there are more echo times TE3, TE4 etc. On the other hand, when the k-space data acquisition is interleaved, partial data for one echo time TE1 may be acquired first followed by acquisition of partial data for another echo time TE2 (and TE3, TE4 etc.). This is again followed by partial data acquisition for first echo time TE1 followed by partial data acquisition for TE2 until all data for the k-space is acquired.

Figure 4:
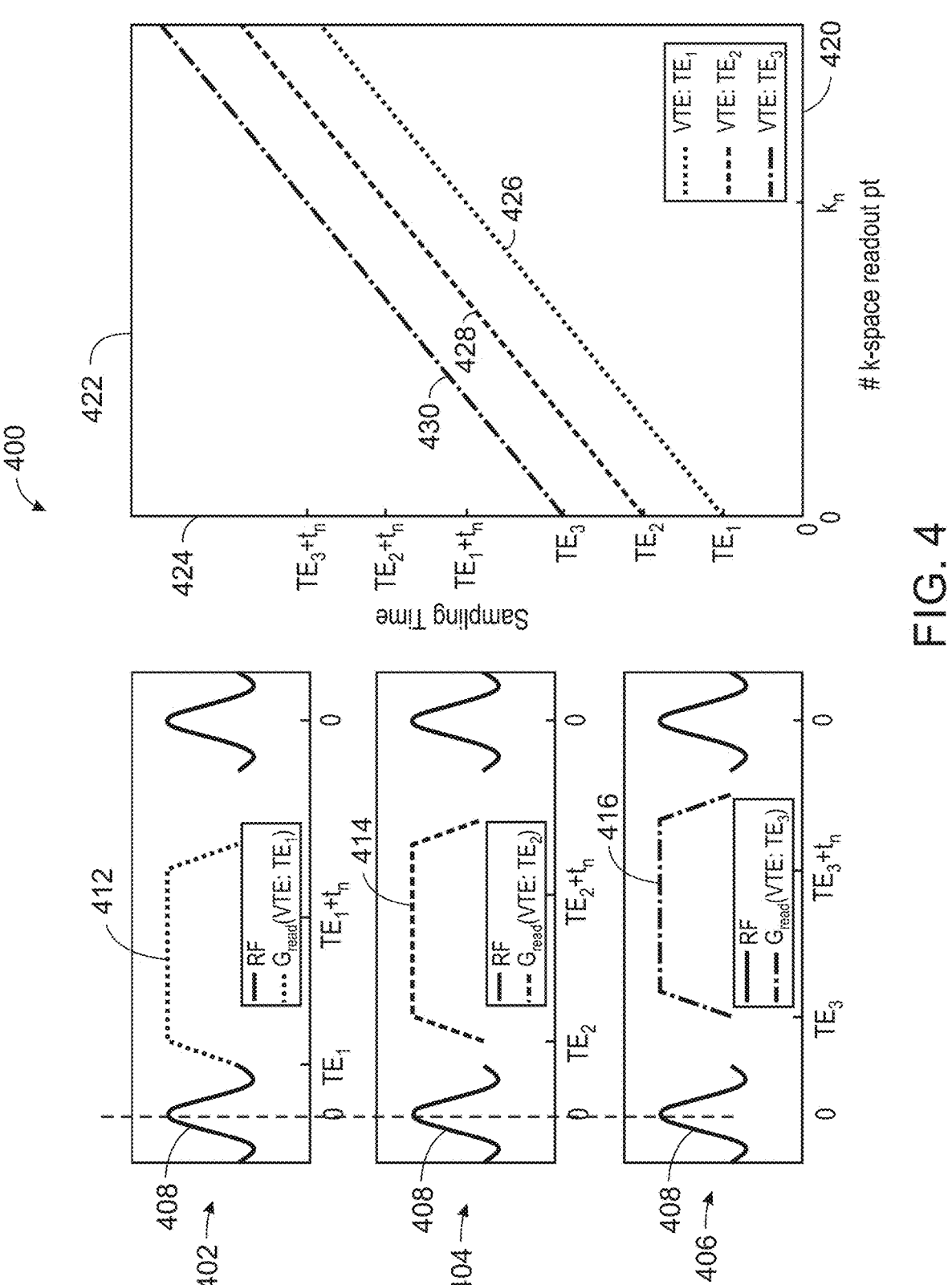
FIG. 4 is a schematic diagram depicting variable echo time acquisition in accordance with an embodiment of the present technique.

FIG. 4 shows a schematic diagram 400 illustrating variable echo time acquisition using three different TEs in accordance with an embodiment of the present technique. Specifically, FIG. 4 shows plots 402, 404 and 406 which show RF pulses 408 followed by the readout gradient 412, 414 and 416 respectively. As can be seen the echo times for gradient signals 412, 414 and 416 are different. For example, the echo time for gradient signal 412 is TE1, the echo time for gradient signal 414 is TE2 and the echo time for gradient signal 416 is TE3. The data acquisition may consist of Cartesian, or non-Cartesian (e.g., radial, spiral, stack-of-stars, . . . ) sampling but should remain the same and only be shifted in between the echo times (e.g., TE1, TE2, TE3) and acquired either in a sequential or interleaved manner.

FIG. 4 also shows a graphical plot 422 having a horizontal axis 420 representing k-space readout point and a vertical axis 424 representing a sampling time. As can be seen from plot 422, each k-space readout point $k_n$ is acquired thrice at times TE1+$t_n$, TE2+$t_n$ and TE3+$t_n$ corresponding to three different echo time readout lines 426, 428 and 430 respectively. Further, the three echo time readout lines 426, 428 and 430 correspond to three different echo times TE1, TE2 and TE3 respectively. In general, the acquired k-space data (data$_m$) at the readout point $k_n$ i.e., data$_m$($k_n$) can be stated as:

$$\text{data}_m(k_n) = \int d^3r \left[ \text{image}_{water}(r) e^{i\omega_{water}(TE_m + t_n)} + \text{image}_{fat}(r) e^{i\omega_{fat}(TE_m + t_n)} \right] e^{ik_n r} \tag{1}$$

where $d^3r$ represents a differential volume element in three-dimensional space, image$_{water}$(r) and image$_{fat}$(r) are the unknown water and fat MRI data respectively in the spatial domain. In other words, these two terms represent water and fat component of the imaged tissue at a specific spatial position or location r. TEm represents echo time, $t_n$ represents a time increment or a time required to acquire the readout point data kn after the echo time, i is the imaginary unit, and $\omega_{water}$ and $\omega_{fat}$ represent the water and fat chemical shift resonance frequencies respectively. $e^{ik_n r}$ accounts for the phase shift introduced by the location r within the imaging volume $d^3r$, relative to the readout point kn in k-space.

After solving for equation (1), one can get:

$$\text{data}_m(k_n) = e^{i\omega_{water}(TE_m+t_n)}\text{data}_{water}(k_n) + e^{i\omega_{fat}(TE_m+t_n)}\text{data}_{fat}(k_n) \quad (2)$$

where, $\text{data}_{water}$ ($k_n$) and $\text{data}_{fat}$ ($k_n$) represent the unknown water and fat MRI data respectively in the k-space domain. If there are M number of echo times that are being acquired then the matrix equation for M variable TEs can be stated as $$\begin{bmatrix} \text{data}_1(k_n) \\ \vdots \\ \text{data}_M(k_n) \end{bmatrix} = CS * \begin{bmatrix} \text{data}_{water}(k_n) \\ \vdots \\ \text{data}_{fat}(k_n) \end{bmatrix} \quad (3)$$

$$\text{with } CS = \begin{bmatrix} e^{i\omega_{water}(TE_1+t_n)} & e^{i\omega_{fat}(TE_1+t_n)} \\ \vdots & \vdots \\ e^{i\omega_{water}(TE_M+t_n)} & e^{i\omega_{fat}(TE_M+t_n)} \end{bmatrix} \quad (4)$$

In equation 3 above, the vector on the left hand side (LHS) is acquired data and the vector on the right hand side (RHS) relating to fat and water data is the unknown term. The variable CS refers to the chemical shift matrix which is defined in equation 4 and is based on echo times and angular frequencies associated with a water resonance and a fat resonance. It should be noted that if there are only 3 number of echo times that are being used then the LHS matrix in equation three will only be a 3 row and 1 column matrix. By solving equation 3, MRI data in k-space for the water signal and the fat signal can be determined. For example, equation (3) may be solved using the Moore Penrose pseudo inverse (+), or other forms of (regularized) matrix inversion:

$$\begin{bmatrix} \text{data}_{water}(k_n) \\ \vdots \\ \text{data}_{fat}(k_n) \end{bmatrix} = CS^+ * \begin{bmatrix} \text{data}_1(k_n) \\ \vdots \\ \text{data}_M(k_n) \end{bmatrix} \quad (5)$$

It should be noted that because equation (5) accounts for the chemical shift (CS), the k-space data determined for water and fat signal will be free from the chemical shift artifacts. After obtaining the water and fat resolved k-space data one can then reconstruct the water and fat image components separately. Thus, by combining all of the plurality of variable echo time signals-data$_1$ ($k_n$) to data$_m$($k_n$) for each of the k-space locations, the water and fat images of the subject that are free from chemical shift artifacts can be obtained. Optionally, the chemical shift of fat can be modeled more accurately using a discrete distribution of chemical shifts instead of a single resonance only. Furthermore, also other tissues, or implants (e.g., silicon) can be included in the chemical shift model.

It should be noted that although the present technique is explained with respect to a three dimensional (3D) radial k-space scenario above, it is equally applicable to 2D and 3D MRI acquisitions using Cartesian, or non-Cartesian (e.g., radial, spiral, stack-of-stars, . . . ) sampling as well as for different types of pulse sequences such as Ultra-Short TE (UTE), Gradient Echo (GRE), Spin Echo (SE), Diffusion Imaging or any other similar pulse sequence technique.

Figure 5:
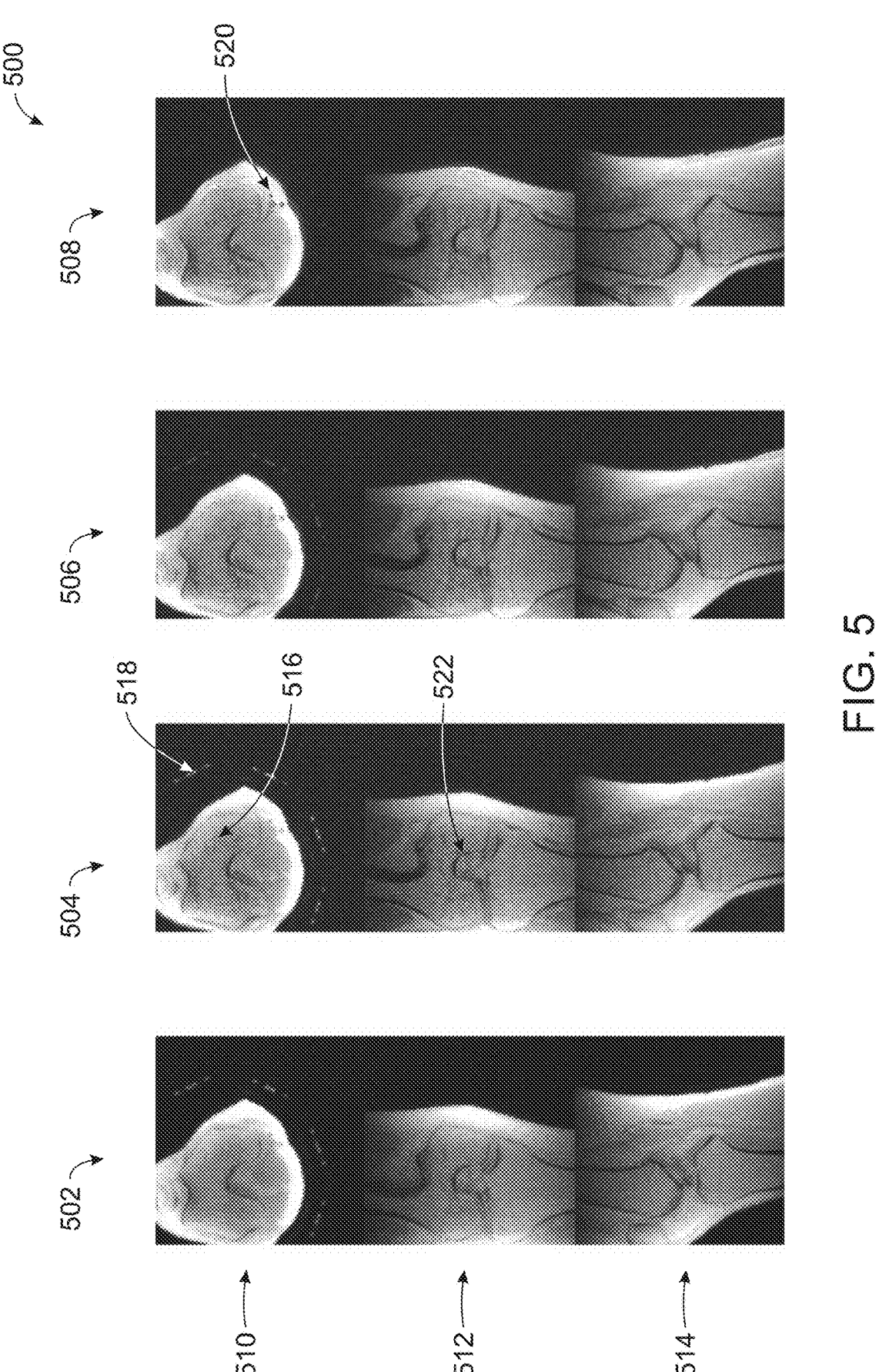
FIG. 5 is a schematic diagram of experimental results of images reconstructed using the acquired k-space data at a plurality of variable echo times in accordance with an embodiment of the present technique.

FIG. 5 is a schematic diagram 500 comparing experimental results of images reconstructed using conventional Ultra-short echo time (UTE) technique and a plurality of variable in-phase echo times in accordance with an embodiment of the present technique. Specifically, column 502 corresponds to the images reconstructed using conventional UTE technique. Further, columns 504, 506 and 508 correspond to in-phase images acquired with variable echo times equivalent to an average echo time of 0.4 ms, 0.6 ms and 0.8 ms respectively. In general, three number of echo times 0.2 ms, 0.4 ms and 0.6 ms were used in acquiring images in column 504. For column 506, the three number of echo times used were 0.4 ms, 0.6 ms and 0.8 ms while for column 508, the echo times used were 0.6 ms, 0.8 ms and 1 ms. Further, rows 510, 512 and 514 correspond to axial, coronal and sagittal cross section of a knee. It should be noted that these images in columns 504, 506 and 508 were reconstructed based on the acquired MR data i.e., the LHS matrix of equation (3) where all readout points $k_n$ corresponding to the complete k-space were used to generate these images.

As can be seen from FIG. 5, there is perfect in-phase appearance for all images in columns 504, 506 and 508 independent of the echo time TE. Further, with longer TE, short T2* structures such as bone 516, tendon 520, ligament 522, plastic coil housing 518 darkens and become more pronounced. In other words, as the average echo time increases from 0.4 ms to 0.8 ms in columns 504 to 508, structures of short T2* signal lifetime rapidly decay resulting in e.g., dark signals for bone, tendons, and plastic coil housing. The in-phase images with different effective TE (i.e., 504, 506, 508) can also be used for quantitative T2* fitting.

Figure 6:
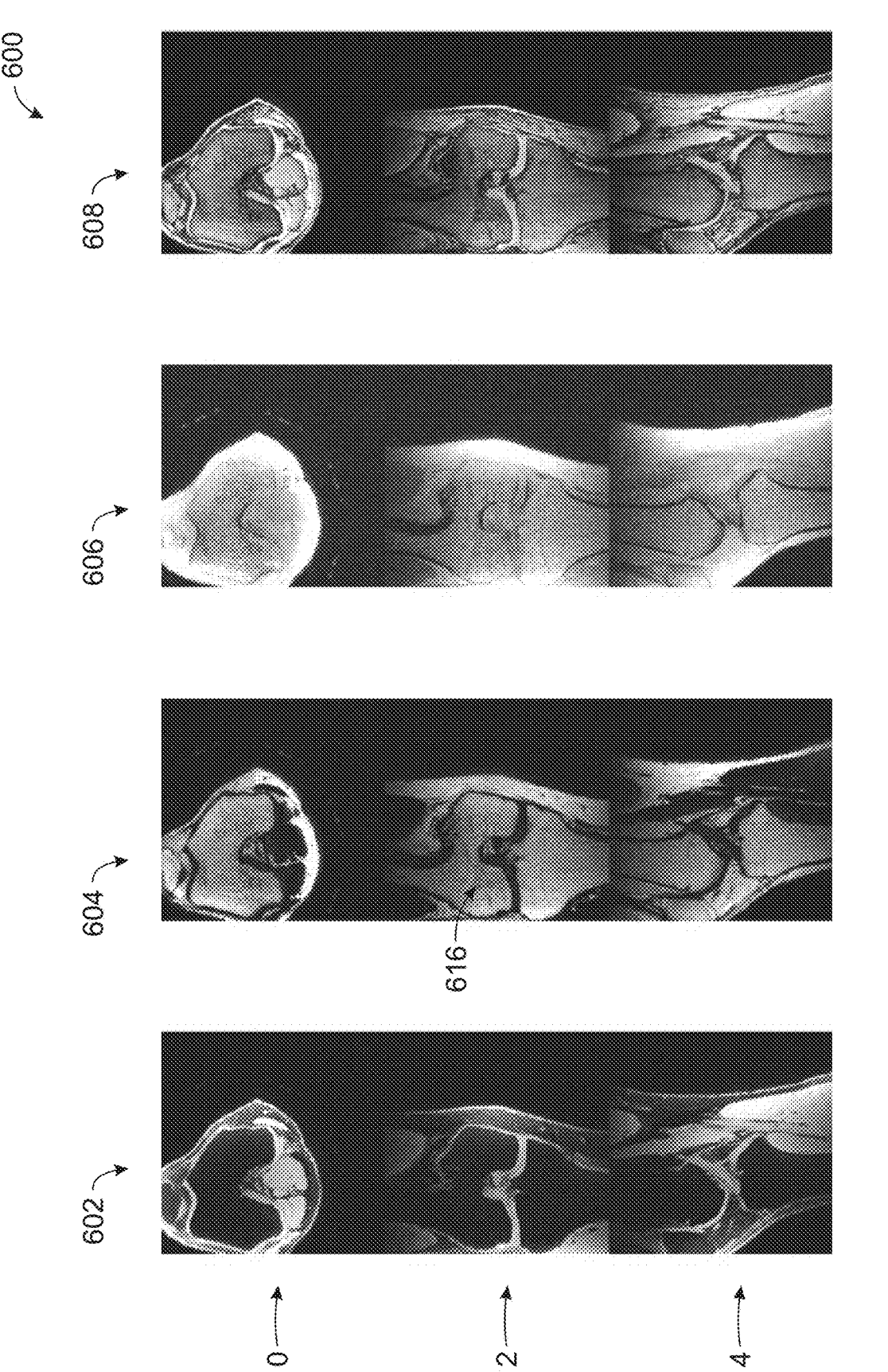
FIG. 6 is a schematic diagram of images reconstructed using a variable echo time method in accordance with an embodiment of the present technique.

FIG. 6 is a schematic diagram 600 of images reconstructed using the variable echo time method in accordance with an embodiment of the present technique. Images in columns 602, 604, 606 and 608 represent to water, fat, perfect in-phase and perfect out-phase images. Further, rows 610, 612 and 614 correspond to axial, coronal and sagittal cross section of a knee. Specifically, the data acquired for the three echo times 0.4 ms, 0.6 ms and 0.8 ms in the experiment of FIG. 5 was used in obtaining the image of FIG. 6. For example, using equation 5 and the data acquired for the three echo times, the water and fat signal k-space data was obtained. The water and fat signal k-space data was then reconstructed to obtained the images in columns 602 and 604.

The in-phase images in column 606 were obtained by addition of water and fat images in columns 602 and 604 respectively. Further, the out-phase images in column 608 were obtained by subtraction of water and fat images in columns 602 and 604 respectively. As can be seen from FIG. 6, soft tissues are clean of chemical shift artifacts. Thus, the trabecular bone structure 616 in these images is clearly visible which is usually not the case in conventional MRI due to chemical shift artifacts.

FIG. 7 is a flow chart 700 representing a method for generating the MR image of a subject with the MRI system 10 according to an embodiment of the present technique. The method 700 may be implemented on the MRI controller 33 in coordination with other components of the MRI system for magnetic resonance imaging with variable echo time in accordance with an embodiment of the present technique. At step 702, the method includes determining a plurality of echo times. The plurality of echo times may be determined based on a desired image contrast, tissue properties being imaged, a clinical application and a signal to noise ratio, for example. However, each of the echo times selected in the plurality of echo times is different from another echo time. In one embodiment, a main echo time is first determined, and the other echo times are determined around the main echo time. For example, if the main echo time is 0.2 ms then the user may decide to use 2 echo times in total around the main echo time such as 0.1 ms and 0.3 ms. In another example, the user may decide to use three echo times 0.1 ms, 0.2 ms, 0.3 ms. In one embodiment, the number of echo times in the plurality of echo times i.e., whether to use 2, 3, 4 or more echo times may be dependent on a chemical shift effect, scan time requirements and image quality requirements.

At step 704, the method includes acquiring a plurality of variable echo time signals corresponding to the plurality of echo times at a plurality of k-space locations. The variable echo time signals refer to readout signal acquisitions. For example, if 3 number of echo times were selected then, for each k-space location $k_n$ there will be 3 readout signal or echo time signal acquisitions $data_1(k_n)$, $data_2(k_n)$ and $data_3$ $(k_n)$. It should be noted that although the echo times are different, the other pulse sequence parameters (i.e., a flip angle, a repetition time, an imaging bandwidth etc.) will be kept identical for taking these measurements. Moreover, the method is equally applicable to pulse sequence techniques such as ultra-short echo time (UTE) as well as 2D gradient echo (GRE), 3D GRE, 2D spin echo (SE), 3D SE imaging techniques.

In one embodiment, these measurements or acquisitions (e.g., $data_1(kn)$, $data_2(kn)$ and $data_3(kn)$) may be sequential or interleaved. With sequential, variable echo time signals all k-space locations for one echo time (e.g., TE1) will be acquired first followed by acquisition of variable echo time signals at all k-space locations for another echo time (e.g., TE2) and so on if there are a greater number of echo times TE3, TE4 etc. On the other hand, when the k-space data acquisition is interleaved, then the variable echo time signals for a partial number of k-space locations for one echo time TE1 may be acquired first followed by acquisition of variable echo signals for a partial number of k-space locations for another echo time TE2 (and TE3, TE4 etc.). This is again followed by acquisition of variable echo signals for another partial number of k-space locations for first echo time TE1 followed by acquisition of variable echo signals for another partial number of k-space locations for TE2 until all data for all the k-space locations is acquired.

At step 706, the method includes generating a water k-space data signal $data_{water}$ ($k_n$), and a fat k-space data signal $data_{fat}$ ($k_n$), for each of the plurality of k-space location $k_n$ based on the plurality of variable echo time signals corresponding to that k-space location i.e., $data_1(kn)$, $data_2(kn)$ and $data_3(kn)$. As shown in equation 5, generating a water k-space data signal, and a fat k-space data signal also involves compensating for the chemical shift by multiplying the plurality of variable echo time signals with an inverse of a chemical shift (CS) matrix. The chemical shift factor is based on echo times and angular frequencies associated with a water resonance and a fat resonance of a tissue to be imaged.

Further, at step 708, the method includes generating a medical image of the subject based on water k-space data signals and fat k-space data signals at the plurality of k-space locations respectively. The medical image may include a water image, a fat image, an in-phase image, an out-phase image, or combinations thereof. In one embodiment, this step includes combining the water k-space data signal at each of the plurality of k-space locations to generate a water k-space and combining the fat k-space data signal at each of the plurality of k-space locations to generate a fat k-space. The water k-space and the fat k-space are then reconstructed to generate the water image and the fat image of the subject respectively.

The method may further include generating a perfect in-phase image and a perfect out-phase image of the subject. In one embodiment the perfect in-phase image is obtained by adding the water image and the fat image of the subject. Further, the perfect out-phase image may be obtained by subtracting the fat image from the water image of the subject. The method may further include an optional step of contrast inversion for the obtained in-phase image to enhance bone visualization.

In one embodiment, the variable echo time MRI technique presented herein may also be used to measure the T2* relaxation time of tissues, which indicates how quickly certain types of signals fade away after an MRI pulse is applied. This is important for characterizing different tissues. This can be achieved by determining the T2* relaxation time by analyzing the exponential decay of the T2* signal over different echo times used. By measuring the exponential decay at various time intervals, it's possible to fit a mathematical model to each pixel's data and create a T2* relaxation time (T2*) map, which highlights variations in relaxation times. Additionally, a susceptibility map can be generated to capture phase effects related to tissue properties. In other words, T2* examines magnitude effects by quantifying the effective transverse relaxation time, while susceptibility focuses on phase effects by quantifying magnetic susceptibility. The latter allows us to differentiate tissues with varying magnetic properties. Creating water, fat, in-phase images for different echo times enables the extraction of T2* and Quantitative Susceptibility Mapping (QSM) techniques that provide more insights into tissue characteristics and magnetic susceptibility variations.

One of the advantages of the present technique is that the technique allows reconstructing perfect in-phase images clear of chemical shift interference artifacts) for an arbitrary echo time TE (not just discrete in-phase echo time) and thereby provides users a parameter (i.e., TE) for tuning cortical bone appearance dependent on the bone anatomy of interest and/or user preferences. The technique can also be extended towards quantitative T2* and/or susceptibility mapping. The method is also expected to improve synthetic CT conversion, depiction of interventional devices (needles, catheters, electrodes, gold seeds etc.), depiction of calcification, and other ultra short echo time (UTE) MR imaging applications.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for imaging a subject using an magnetic resonance imaging (MRI) system comprising:

determining a plurality of echo times;

acquiring a plurality of variable echo time signals corresponding to the plurality of echo times at each of a plurality of k-space locations;

generating a water k-space data signal and a fat k-space data signal for each of the plurality of k-space locations based on the plurality of variable echo time signals corresponding to that k-space location; and generating a medical image of the subject based on water k-space data signals and fat k-space data signals at the plurality of k-space locations respectively.

2. A magnetic resonance imaging (MRI) system, comprising:

a magnet configured to generate a polarizing magnetic field about at least a portion of a subject arranged in the MRI system;

a gradient coil assembly including a readout gradient coil, a phase gradient coil, a slice selection gradient coil configured to apply at least one gradient field to the polarizing magnetic field;

a radio frequency (RF) system configured to apply an RF field to the subject and to receive magnetic resonance signals from the subject;

a processing system programmed to:

determine a plurality of echo times;

acquire a plurality of variable echo time signals corresponding to the plurality of echo times at each of a plurality of k-space locations;

generate a water k-space data signal and a fat k-space data signal for each of the plurality of k-space locations based on the plurality of variable echo time signals corresponding to that k-space location; and generate a medical image of the subject based on water k-space data signals and fat k-space data signals at the plurality of k-space locations respectively.

3. The method of claim 1, wherein the plurality of echo times are determined based on a desired image contrast, tissue properties being imaged, clinical application and signal to noise ratio.

4. The method of claim 1, wherein each of the echo time selected in the plurality of echo times is different from another echo time.

5. The method of claim 1, wherein acquiring the plurality of variable echo time signals for the plurality of echo times comprises keeping other pulse sequence parameters identical, wherein the other pulse sequence parameters include a flip angle, a repetition time, and an imaging bandwidth.

6. The method of claim 1, further comprising using a pulse sequence technique including an ultra-short echo time (UTE), 2D gradient echo (GRE), 3D GRE, 2D spin echo (SE), or 3D SE imaging technique.

7. The method of claim 1, wherein acquiring the plurality of variable echo time signals comprises a sequential or an interleaved acquisition.

8. The method of claim 1, wherein generating the water k-space data signal and the fat k-space data signal for each of the plurality of k-space locations includes compensating for a chemical shift by multiplying the plurality of variable echo time signals with an inverse of a chemical shift matrix.

9. The method of claim 1, wherein the medical image comprises a fat image, a water image, a perfect in-phase image, a perfect out-phase image, or combinations thereof.

10. The method of claim 1 further comprises generating a relaxation time (T2*) map and a susceptibility map by analyzing an exponential decay of T2* signals over the plurality of echo times used.

11. The MRI system of claim 2, wherein the processing system is programmed to determine the plurality of echo times based on a desired image contrast, tissue properties being imaged, clinical application and a signal to noise ratio.

12. The MRI system of claim 2, wherein each of the echo time selected in the plurality of echo times is different from another echo time.

13. The MRI system of claim 2, wherein the processing system is programmed to acquire the plurality of variable echo time signals for the plurality of echo times by keeping other pulse sequence parameters identical, wherein the other pulse sequence parameters include a flip angle, a repetition time and an imaging bandwidth.

14. The MRI system of claim 2, wherein the processing system is programmed to acquiring the plurality of variable echo time signals for the plurality of echo times in a sequential manner or an interleaved manner.

15. The MRI system of claim 2, wherein the processing system is programmed to generate the water k-space data signal and the fat k-space data signal for each of the plurality of k-space locations by compensating for a chemical shift by multiplying the plurality of variable echo time signals with an inverse of a chemical shift factor.

16. The MRI system of claim 2, wherein the medical image includes a fat image, a water image, a perfect in-phase image, a perfect out-phase image, or combinations thereof.

17. The MRI system of claim 2, wherein the processing system is further programmed to generate a relaxation time (T2*) map and a susceptibility map by analyzing an exponential decay of T2* signals over the plurality of echo times used.

18. The method of claim 1 wherein the plurality of echo times include, for each k-space location, echo times comprising a base echo time and a time increment tn, wherein tn represents a time required to acquire the readout point data for the k-space location.

19. The method of claim 8, wherein the chemical shift matrix is based on echo times and angular frequencies associated with a water resonance and a fat resonance of a tissue to be imaged.

20. The MRI system of claim 15, wherein the chemical shift factor is based on echo times and angular frequencies associated with a water resonance and a fat resonance of a tissue to be imaged.

\* \* \* \* \*